US009385294B2

(12) United States Patent
Rigetti et al.

(10) Patent No.: US 9,385,294 B2
(45) Date of Patent: Jul. 5, 2016

(54) DIAMOND SUBSTRATES FOR SUPERCONDUCTING QUANTUM CIRCUITS

(71) Applicants: International Business Machines Corporation, Armonk, NY (US); Brooklyn Quantum Works, Denver, CO (US)

(72) Inventors: Chad T. Rigetti, Berkeley, CA (US); Lafe Spietz, Denver, CO (US)

(73) Assignees: INTERNATIONAL BUSINESS MACHINES CORPORATION, Armonk, NY (US); BROOKLYN QUANTUM WORKS, Denver, CO (US)

( * ) Notice: Subject to any disclaimer, the term of this patent is extended or adjusted under 35 U.S.C. 154(b) by 39 days.

(21) Appl. No.: 14/497,817

(22) Filed: Sep. 26, 2014

(65) Prior Publication Data

US 2016/0093790 A1    Mar. 31, 2016

(51) Int. Cl.
*H01L 39/22*        (2006.01)
*H01L 39/24*        (2006.01)
*H01L 39/02*        (2006.01)
*H01L 39/12*        (2006.01)
*G06N 99/00*        (2010.01)

(52) U.S. Cl.
CPC ............ *H01L 39/223* (2013.01); *G06N 99/002* (2013.01); *H01L 39/025* (2013.01); *H01L 39/12* (2013.01); *H01L 39/2493* (2013.01)

(58) Field of Classification Search
CPC . H01L 39/223; H01L 39/2493; H01L 39/025; H01L 39/12
See application file for complete search history.

(56) References Cited

U.S. PATENT DOCUMENTS

| 7,122,837 | B2 | 10/2006 | Linares et al. |
| 8,119,253 | B2 | 2/2012 | Galbiati |
| 2006/0157713 | A1* | 7/2006 | Linares ................ B82Y 10/00 257/77 |
| 2007/0252081 | A1 | 11/2007 | Munro et al. |
| 2014/0037932 | A1* | 2/2014 | Twitchen ................ C30B 25/02 428/220 |
| 2014/0113828 | A1* | 4/2014 | Gilbert ................ H01L 39/126 505/100 |

FOREIGN PATENT DOCUMENTS

| JP | S63312694 A | 12/1988 |
| JP | H0697524 A | 4/1994 |
| JP | 2007013688 A | 1/2007 |
| JP | 2007103688 A * | 4/2007 |
| JP | 2011054893 A | 3/2011 |

OTHER PUBLICATIONS

Machine translation of JP-2007-103688 A. Apr. 2007.*

* cited by examiner

*Primary Examiner* — Lex Malsawma
(74) *Attorney, Agent, or Firm* — Cantor Colburn LLP; Vazken Alexanian (57) ABSTRACT

A mechanism relates to a superconducting quantum system. A diamond substrate layer is included. A superconducting quantum device is disposed on the diamond substrate layer. The superconducting quantum device includes a superconducting quantum circuit formed on top a surface of the diamond substrate layer.

19 Claims, 7 Drawing Sheets

DIAMOND SUBSTRATES FOR SUPERCONDUCTING QUANTUM CIRCUITS

BACKGROUND

The present invention relates to quantum computing, and more specifically, to systems and fabrication methods for diamond substrates that can be implemented for superconducting quantum circuits.

Quantum computation with superconducting quantum circuits exploits the intrinsic coherence of the superconducting state, into which all electrons are condensed. Quantum information is stored in the number of superconducting electrons (qubit), in the direction of a current (flux qubit) or in oscillatory states (phase qubit). Systems are fabricated with thin film technology and operated at temperatures below 100 milliKelvin (mK). Measurements are performed with integrated on-chip instruments.

In quantum information theory, a quantum circuit is a model for quantum computation in which a computation is a sequence of quantum gates, which are reversible transformations on a quantum mechanical analog of an n-bit register. This analogous structure is referred to as an n-qubit register.

The quantum computer (also known as a quantum supercomputer) is a computation device that makes direct use of quantum-mechanical phenomena, such as superposition and entanglement, to perform operations on data. Quantum computers are different from digital computers based on transistors. Whereas digital computers require data to be encoded into binary digits (bits), each of which is always in one of two definite states (0 or 1), quantum computation uses qubits (quantum bits), which can be in superpositions of states.

Moreover, a qubit or quantum bit is a unit of quantum information. A qubit is a two-state quantum-mechanical system, such as the polarization of a single photon: here the two states are vertical polarization and horizontal polarization. In a classical system, a bit would have to be in one state or the other, but quantum mechanics allows the qubit to be in a superposition of both states at the same time, a property which is fundamental to quantum computing.

SUMMARY

Exemplary embodiments include a superconducting quantum system. The superconducting quantum system includes a diamond substrate layer. A superconducting quantum device is disposed on the diamond substrate layer. The superconducting quantum device includes a superconducting quantum circuit formed on top a surface of the diamond substrate layer.

Exemplary embodiments include a method of fabricating a superconducting quantum system. The method includes preparing a diamond substrate layer, and disposing a superconducting quantum device on the diamond substrate layer. The superconducting quantum device includes a superconducting quantum circuit formed on top a surface of the diamond substrate layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Superconducting quantum circuits are a leading candidate technology for quantum information processing systems. These circuits can be designed and constructed to fulfill several different roles that are required in quantum computer science and in the construction and operation of a quantum information processing device. Among these are information storage, information processing, signal amplification, and controlling quantum coherent interactions between various modes of a composite quantum system. For example, one of the simplest superconducting qubit designs is the transmon, including a large capacitance of characteristic energy $E_c$ in parallel with a nonlinear inductance from a single small Josephson junction, having characteristic energy $E_j$, such that $E_j \gg E_c$.

Superconducting quantum circuits are typically micro-fabricated on a dielectric substrate. Traditional substrates are high-resistivity silicon and sapphire. Sapphire has a higher thermal conductivity at normal operating temperatures of approximately (~) 10 mK. There is significant evidence that the loss tangent of sapphire at these temperatures and at single-photon power levels is smaller than that of silicon substrates, which implies a lower rate of energy dissipation by the bulk material in the substrate and therefore facilitates longer coherent lifetimes of the quantum states of the qubit circuit. Most recent advances and developments on superconducting qubits have emerged from systems fabricated on sapphire substrates.

In exemplary embodiments, the systems and methods described herein include a superconducting quantum circuit micro-fabricated with the standard fabrication processes and techniques as used for sapphire and silicon substrates, but instead implementing a diamond substrate. The superconducting quantum circuit may be of any geometry or type; it may act as a (quantum) information storing or processing unit (e.g., a quantum bit), as a means of controlling interactions between other subcircuits, or as an amplifier or source of electromagnetic signals. In the specific case of a quantum bit, the circuit may be measured and controlled by externally produced electromagnetic signals that couple to either a charge, flux or phase circuit variable. It will be appreciated that any suitable superconducting quantum circuit and corresponding fabrication process can be implemented.

The micro-fabrication of a superconducting quantum circuit on diamond substrate has, among others, the following. First, diamond is a significantly better thermal conductor at typical quantum circuit operating temperatures of approximately 10 mK than silicon or sapphire. Second, diamond's mechanical rigidity makes it possible to use extremely thin substrates, which decreases the overall amount of dielectric material present in the system and thereby reduces potential sources of coherence-limiting energy loss. Third, the lower dielectric constant of diamond compared to both sapphire and silicon implies that electric fields show a weaker preference for the substrate relative to vacuum. Independent of the thinner substrate and overall volume arguments, this feature leads to a reduction of the participation ratio (the fraction of the energy of an electromagnetic mode stored in a particular material) of the substrate. Fourth, it can reasonably be expected that the single-photon loss tangent of diamond at 10 mK is smaller than even sapphire, as purity levels of diamond are believed to exceed those of sapphire. Evidence towards this can be gleaned from experiments on nitrogen-vacancy centers, which routinely achieve coherence times on the millisecond time scale.

Figure 1A:
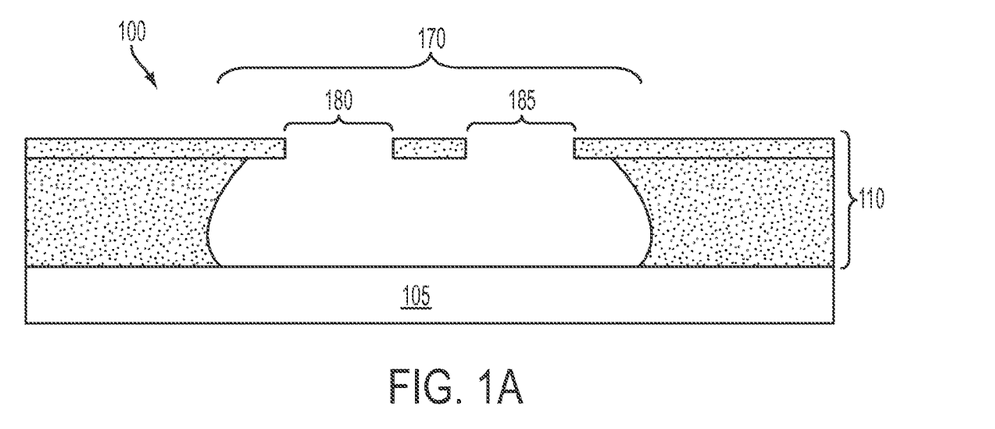
FIG. 1A illustrates an exemplary intermediate structure of a quantum superconducting device in accordance with exemplary embodiments.

FIG. 1A illustrates a cross-sectional view of an exemplary intermediate structure 100 of a quantum superconducting device. A diamond substrate 105 is deposited, prepared, and/or created. Synthetic diamonds can be created as understood by one skilled in the art. The diamond substrate 105 is bulk diamond. The thickness of the diamond substrate 105 may range from 50 nanometers to hundreds of microns, and the thickness of the diamond substrate 105 may particularly be 100 nm. Hundreds of microns may be 100, 200, 300, 400, 500, 600, through 900 micrometers.

A bi-layer resist 110 is deposited on the diamond substrate 105, and two openings 180 and 185 (e.g., elongated openings) are formed in the bi-layer resist 110. The bi-layer resist 110 may be etched to have an undercut pattern 170 in which the quantum superconducting circuit/device is to be formed (further is discussed below). The bi-layer resist 110 may include materials such as silicon dioxide, germanium dioxide, and/or any suitable dielectric. The thickness of the bi-layer resist 110 may range from 50 nm to a few microns.

Figure 1B:
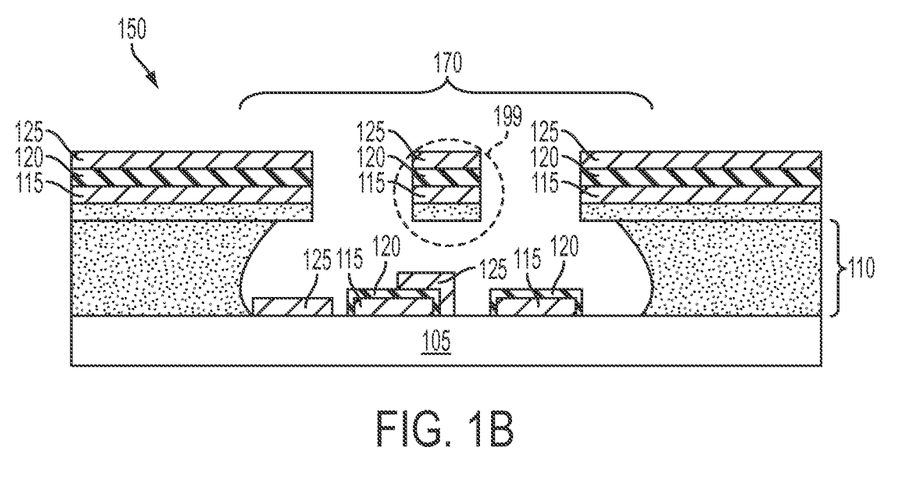
FIG. 1B illustrates another exemplary intermediate structure of a quantum superconducting device in accordance with exemplary embodiments.

FIG. 1B illustrates a cross-sectional view of another exemplary intermediate structure 150 of a quantum superconducting device. A first superconducting (metal) layer 115 is deposited on top of the diamond substrate 105 and the bi-layer resist 110. A thin oxidized layer 120 is deposited on top of the superconducting layer 115, and a second superconducting (metal) layer 125 is deposited on top of the thin oxidized layer 120.

The thickness of the first superconducting (metal) layer 115 may range from 5 nm to 100 nm. The thickness of the thin oxidized layer 120 may range from 0.2 nm to 2 nm. The thickness of the second superconducting (metal) layer 125 may range from 5 nm to 200 nm.

Figure 1C:
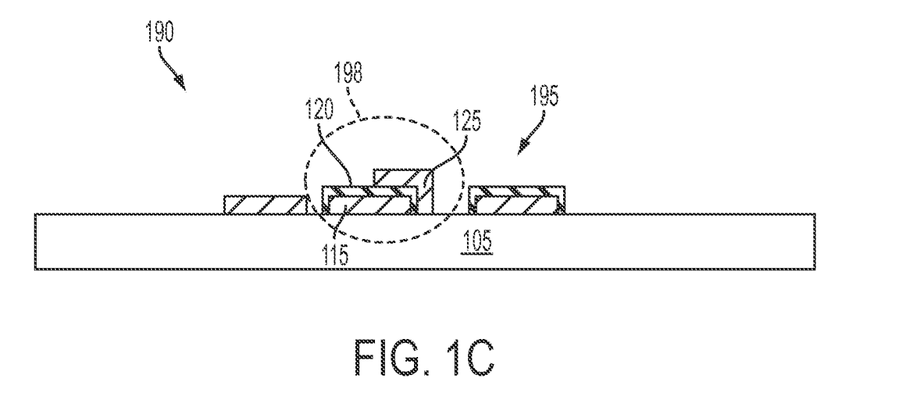
FIG. 1C illustrates an exemplary final structure of a quantum superconducting device in accordance with exemplary embodiments.

FIG. 1C illustrates a cross-sectional view of an exemplary final structure 190 of a quantum superconducting device. The bi-layer resist 110 and all layers on top of the bi-layer resist 110 have been removed to leave the quantum superconducting device/circuit 195.

Figure 3:
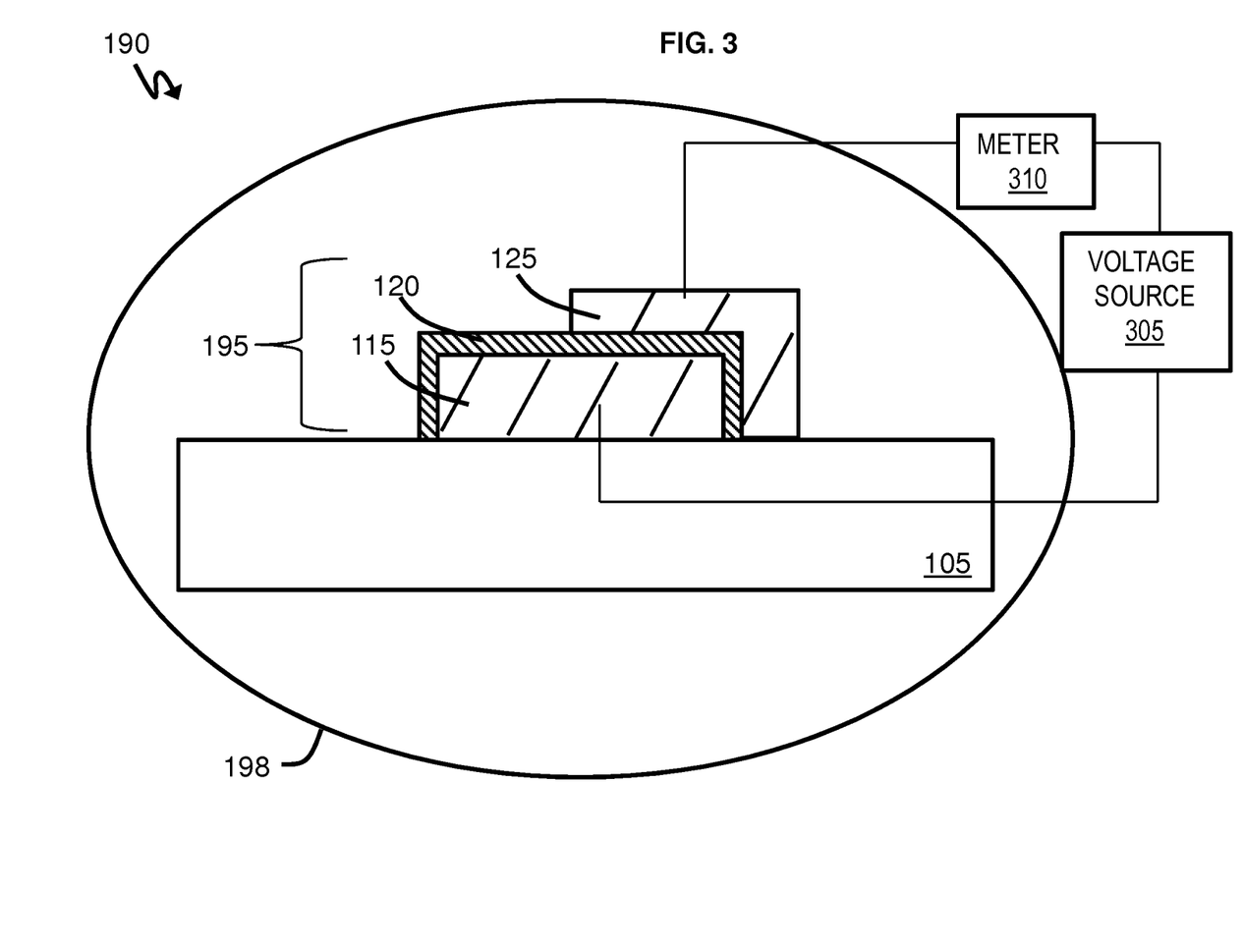
FIG. 3 illustrates an enlarged view of the quantum superconducting circuit on the diamond substrate in accordance with exemplary embodiments.

Referring to FIG. 1B, the Niemeyer-Dolan technique, also called the Dolan technique, can be used to make the quantum superconducting device/circuit 195 as understood by one skilled in the art. View 198 is illustrated with a circle in FIG. 1C, and view 198 represents an enlarged view of a portion of the circuit 195. As taken from FIG. 1C, FIG. 3 illustrates a cross-sectional view of the enlarged view 198 according to an embodiment. In FIG. 3, the quantum superconducting device/circuit 195 has been formed on the diamond substrate 105. The layers 115, 120, 125 of the quantum superconducting device/circuit 195 form a superconducting tunnel junction (STJ), also known as a superconductor-insulator-superconductor tunnel junction (SIS), which is an electronic device consisting of two superconductors (i.e., layers 115 and 125) separated by a very thin layer of insulating material (i.e., layer 120). Current passes through the junction (i.e., through the thin oxidized layer 120) via the process of quantum tunneling. The STJ is a type of Josephson junction. The superconducting layers 115 and 125 may be connected to a voltage source 305 via connectors, wires, leads, etc., and a current meter 310 may added to measure the current of the quantum superconducting device/circuit 195 for quantum computing and/or quantum information storage (all of which may be implemented in computer 400 discussed below).

Figure 2A:
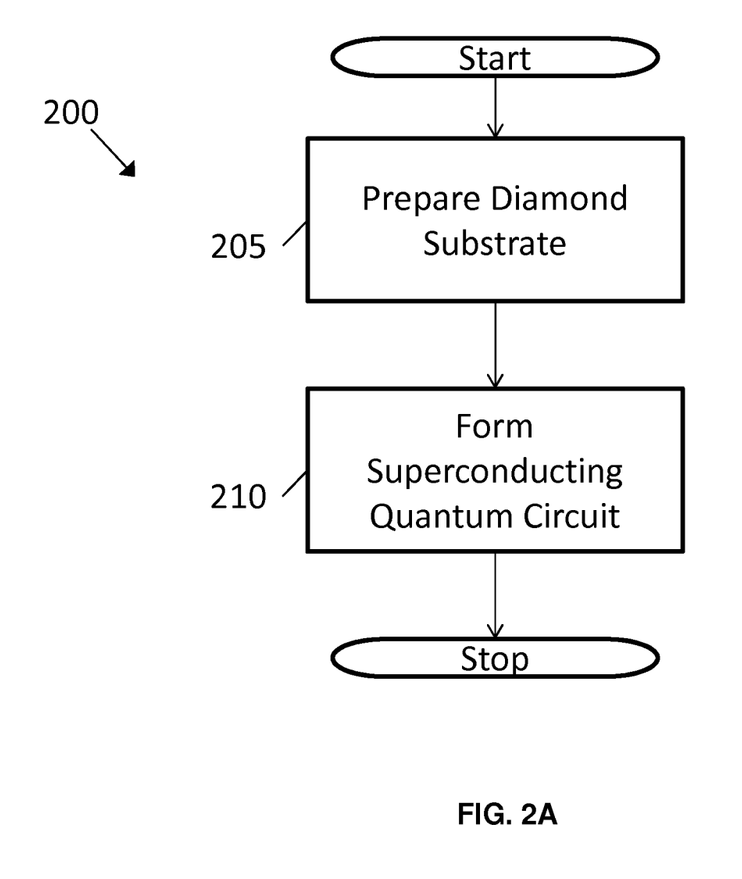
FIG. 2A illustrates a flow chart of a method for fabricating a quantum superconducting device in accordance with exemplary embodiments.

Further details of forming the structures 100, 150, and 190 for the quantum superconducting device are provided below. FIG. 2A illustrates a flow chart of a method 200 for fabricating the quantum superconducting device 190 in accordance with exemplary embodiments. Reference can be made to FIGS. 1 and 3 discussed herein.

At block 205, the diamond substrate 105 is prepared. In exemplary embodiments, any suitable single-crystal or polycrystalline synthetic diamond substrate 105 can be implemented. As further described herein, any previously developed fabrication procedures can be implemented for making superconducting quantum circuits (e.g., an aluminum (Al) Josephson junction-based devices). The Josephson junction (a superconductor-insulator-superconductor sandwich) is one example. As described herein, the superconducting quantum circuit can be any suitable circuit including but not limited to a qubit, a transmon and any circuit implementing a Josephson junction.

In exemplary embodiments, a crystal synthetic diamond substrate can be produced by chemical vapor deposition (CVD) or high pressure, high temperature (HPHT) synthesis. Both manufacturing processes use tightly controlled growth conditions, and the material produced is then subject to equally stringent quality control procedures. The resulting single crystal synthetic diamond is an engineered synthetic material that is highly consistent and has predictable properties and behavior. Although natural diamond can be implemented, natural diamond material varies significantly in key properties and requires careful selection. The single crystal synthetic diamond is then processed into geometrically regular shapes suitable for the substrate 105 and the desired superconducting quantum device. In exemplary embodiments, high-quality polycrystalline CVD diamond substrates can be grown using a plasma-assisted chemical vapor deposition process, laser-cut to the required dimensions, and the surface of the substrate 105 finished according to the type of superconducting quantum device subsequently fabricated. It can be appreciated that other suitable techniques can be implemented to prepare the substrate 105, such as but not limited to edge-grinding, laser-engraving, and optical assembly design and fabrication.

At block 210, a superconducting quantum device/circuit 195 is fabricated on the substrate 105. Fabrication of the superconducting quantum device may proceed by any of a number of processes that are well-known in the art. Two examples are (1) subtractive patterning of a trilayer (superconductor(s)-insulator-superconductor(s)) material stack or (2) the Dolan bridge process. Although several other qubit fabrication procedures are contemplated, the Dolan Bridge technique is described herein as an illustrative example.

Figure 2B:
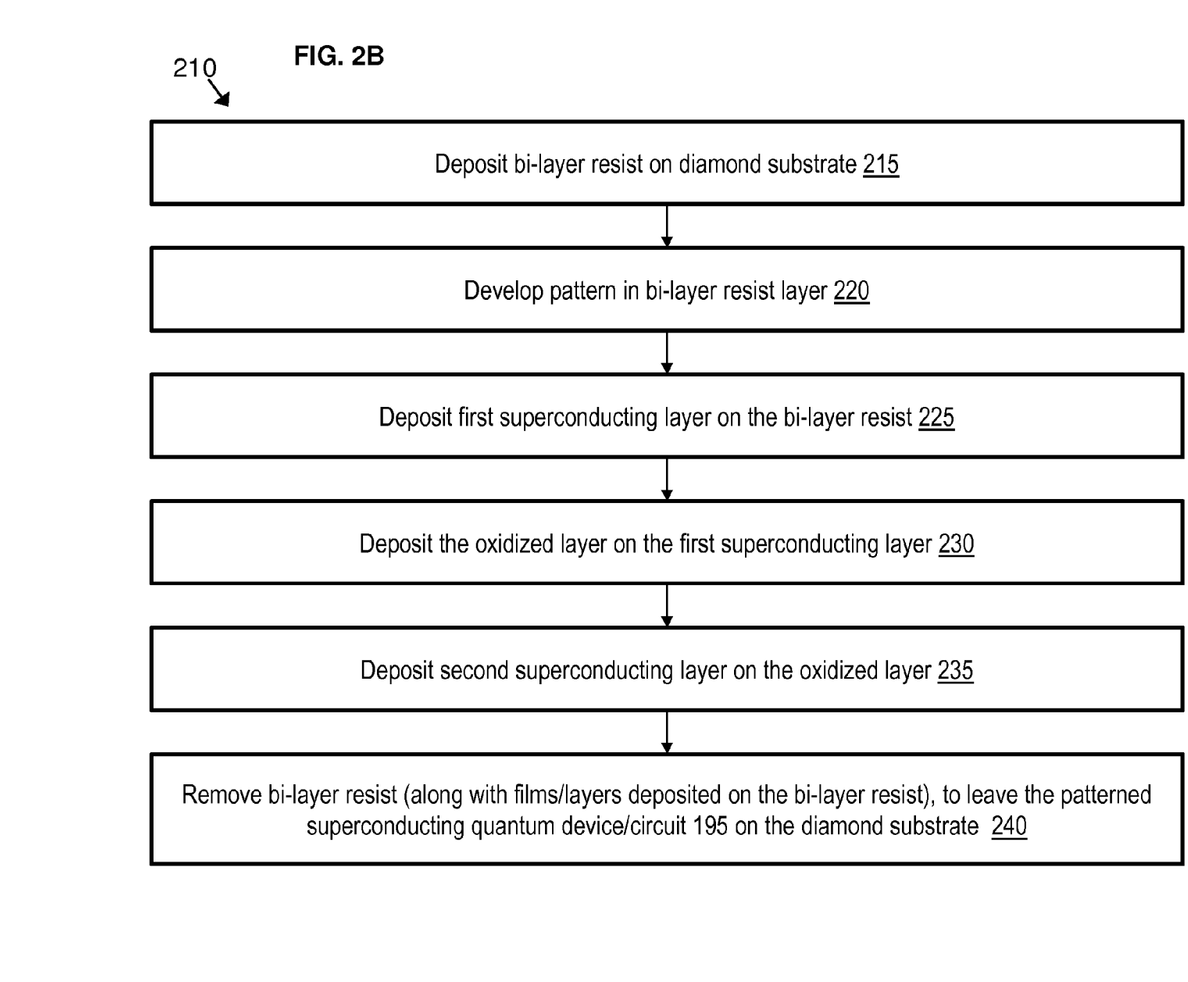
FIG. 2B illustrates a flow chart of further details of fabricating a quantum superconducting circuit in accordance with exemplary embodiments.

FIG. 2B illustrates further details of block 210. First, a bi-layer resist 110, for either electron beam or optical lithography, is spun onto the substrate 105 at block 215. At block 220, the bi-layer resist 110 is baked and prepared for lithographic exposure, lithographically exposed, and then developed to produce the lithographic pattern on the bi-layer resist 110, as shown in FIG. 1A.

As one example, the bilayer of resist 110 may be spun on the substrate 105 such that the bi-layer resist 110 consists of a copolymer methyl methacrylate (MMA) layer and a subsequent thinner layer of polymethyl methacrylate (PMMA). Using electron-beam lithography, a pattern (e.g., including the openings 180, 185) for the superconducting quantum device 150 is written into the resist layer 110. This procedure is followed by development in an MIBK:IPA (Methyl Isobutyl Ketone (MIBK) Isopropyl alcohol (IPA)) (1:3) solution for about one minute, which eats away all the areas exposed to the electron beam (to form the undercut pattern 170). The MMA layer is more sensitive to the electron beam, which creates areas of undercut PMMA (thus forming the undercut pattern 170). As such, a suspended bridge 199 out of the PMMA can be made with no MMA beneath.

Next, at block 225, the substrate 105 is placed into a thin film deposition system, and a first aluminum (Al) layer 115 (or other appropriate metal for the superconducting quantum device) is deposited at an angle (though openings 180 and 185) as shown in FIG. 1B. As understood by one skilled in the art, deposition of the aluminum layer 115 can be applied at a desired angle through the openings 180 and 185 to form the layer 115 within the undercut pattern 170.

At block 230, oxygen gas is introduced into the vacuum deposition system to oxidize the surface of the deposited first Al layer 115 to form the oxidized layer 120. After a sufficient oxidation time, as determined by the desired junction properties, the gas is pumped from the chamber. At block 235, the sample (structure 150) is then rotated and a second Al layer 125 is deposited on the oxidized layer 120. An Al—Al oxide-Al tunnel barrier is now formed where the two films overlap at the first and second AL layers 115, 125 and the oxide layer 120. At block 240, the sample (i.e., structure 150) is placed into a solvent which removes the bi-layer resist 110 and 'lifts off' the films deposited onto the top and side walls of the bi-layer resist 110, leaving only the patterned superconducting quantum device 195 on the diamond substrate 105 as structure 190 shown in FIG. 1C. It can be appreciated that the structure 190 of superconducting quantum device/circuit 195 can be fabricated by any suitable fabrication techniques. Other fabrication processes are known and could be used, such as Nb—AlOx-Nb trilayer processes.

Note that as one example when forming the superconducting layers 115 and 125, the sample (e.g., structures 100 and 150) may be placed in an e-beam evaporator where Al is evaporated at two angles (through openings 180 and 185) with oxidation (to form oxidized layer 120) (in an $Ar/O_2$ atmosphere) between Al evaporations. The junction (filled with the oxidized layer 120) is formed in the overlap area of the superconducting layers 115 and 125. The remaining resist and unwanted metal is removed by placing the sample in acetone. Using this lift-off technique, junction areas can be made ranging from 20 $mm^2$ to 50 $nm^2$. This basic fabrication process can be used with other extra fabrication steps such as PECVD, optical lithography, and RIE to make more complicated devices. Finally, the substrate 105 is diced into small ($\sim 1 \times 1$ $cm^2$) chips. Note that multiple quantum superconductor circuits 195 can be simultaneously formed on each structure 190.

Embodiments discussed herein utilize bulk diamond substrates 105 as opposed to thin film diamond layers. Particularly, the superconducting quantum circuits 195 are formed directly on top of the bulk diamond substrate 105. The bulk diamond substrate 105 is mechanically robust enough to act as the carrier substrate of the quantum circuit, while a thin film is grown or deposited on another carrier.

According to an embodiment, a method of fabricating a superconducting quantum system provided which includes preparing a diamond substrate layer; and disposing a superconducting quantum device on the diamond substrate layer. The superconducting quantum device comprises a superconducting quantum circuit 195 formed on top a surface of the diamond substrate layer 105.

In one case, the diamond substrate layer 105 is prepared from a single-crystal diamond substrate, a poly-crystalline synthetic diamond substrate, and/or both the single-crystal diamond substrate and the poly-crystalline synthetic diamond substrate. The diamond substrate layer 105 is prepared from natural diamond.

In one case, the superconducting quantum circuit 195 comprises a first superconductor layer 115 disposed (directly) on top of the diamond substrate layer 105, an oxidized layer 120 disposed on top of the first superconductor layer, and a second superconductor layer 125 disposed on top of the oxidized layer such that the first superconductor layer and the second superconductor layer sandwich the oxidized layer in between.

In one case, the superconducting quantum device includes a Josephson junction. The superconducting quantum device is at least one of a qubit and/or a transmon style qubit. The superconducting quantum device is fabricated by subtractive patterning of a material stack. The superconducting quantum device is fabricated by a Dolan bridge process.

In one case, the diamond substrate layer is bulk diamond and not thin film diamond, and the bulk diamond has a thickness in a range of 50 nm to hundreds of microns. The thin film diamond has a thickness in a range of 1 nm to 5 nm. The thin film diamond would be less that about 5 nm. One skilled in the art understands that the bulk diamond is not thin film diamond.

The diamond substrate is at least one of generated by chemical vapor deposition and generated by plasma assisted chemical vapor deposition.

Figure 4:
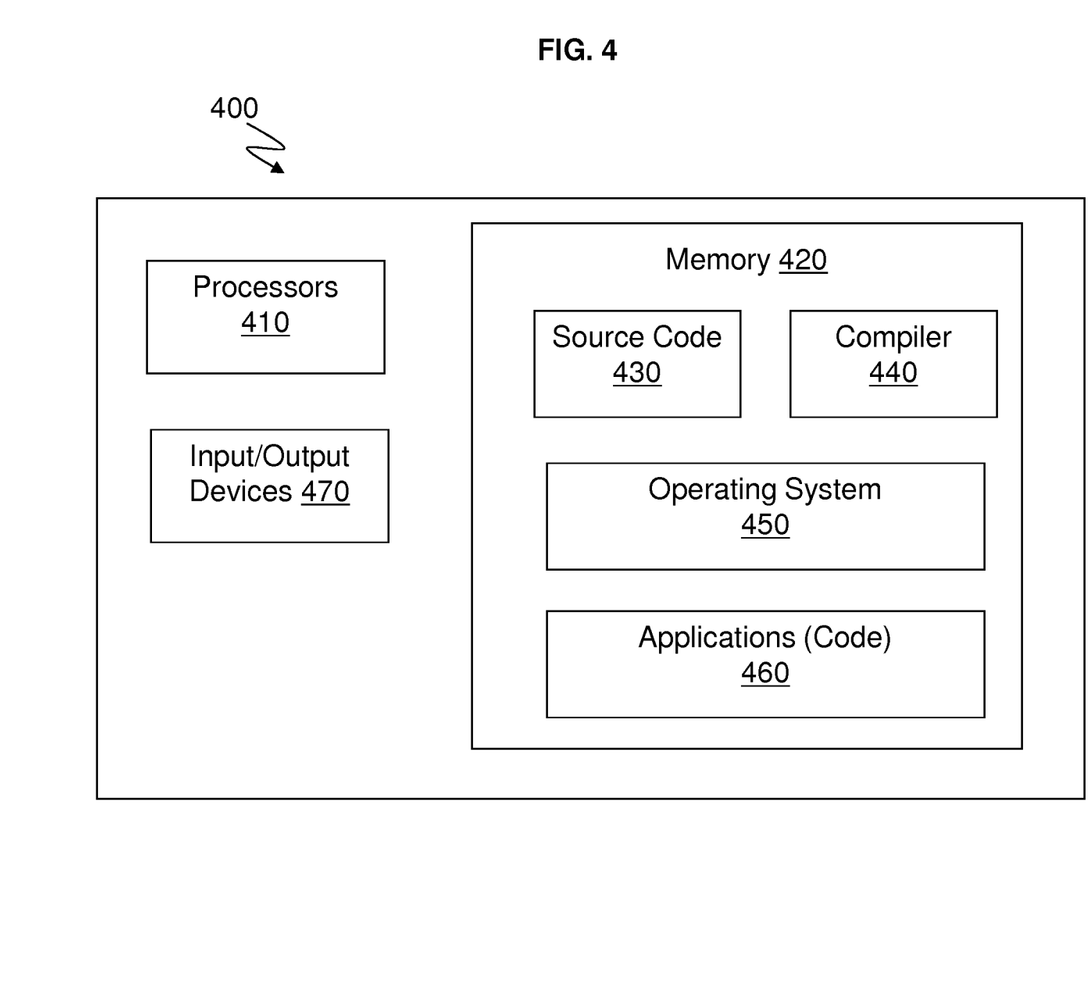
FIG. 4 illustrates a computer having implementing features discussed herein, in accordance with exemplary embodiments.

Now turning to an example implementation in a computer system, FIG. 4 illustrates an example of a computer 400 that may include, integrate, and/or implement features discussed herein according to exemplary embodiments.

For quantum computing and/or quantum information processing, memory 420 may include one or more of the superconducting quantum circuits 195 on the structure 190 (e.g., as one or more computer chips), along with other types of memory discussed herein. Various methods, procedures, circuits, elements, and techniques discussed herein may incorporate and/or utilize the capabilities of the computer 400. One or more of the capabilities of the computer 400 may be utilized to implement, to incorporate, to connect to, and/or to support any element discussed herein (as understood by one skilled in the art) in FIGS. 1-4. For example, the elements 190, 195 may incorporate and/or be incorporated in any of the hardware features discussed in the computer 400. Also, the elements 305 and 310 (and/or their functionality) may be included in the computer 400.

Generally, in terms of hardware architecture, the computer 400 may include one or more processors 410, computer readable storage memory 420, and one or more input and/or output (I/O) devices 470 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 410 is a hardware device for executing software that can be stored in the memory 420. The processor 410 can be virtually any custom made or commercially available processor, a central processing unit (CPU), a data signal processor (DSP), or an auxiliary processor among several processors associated with the computer 400, and the processor 410 may be a semiconductor based microprocessor (in the form of a microchip) or a microprocessor.

The computer readable memory 420 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 420 may incorporate electronic, magnetic, optical, and/or other types of storage media. Note that the memory 420 can have a distributed architecture, where various components are situated remote from one another, but can be accessed by the processor 410.

The software in the computer readable memory 420 may include one or more separate programs, each of which comprises an ordered listing of executable instructions for implementing logical functions. The software in the memory 420 includes a suitable operating system (O/S) 450, compiler 440, source code 430, and one or more applications 460 of the exemplary embodiments. As illustrated, the application 460 comprises numerous functional components for implementing the features, processes, methods, functions, and operations of the exemplary embodiments. The application 460 of the computer 400 may represent numerous applications, agents, software components, modules, interfaces, controllers, etc., as discussed herein but the application 460 is not meant to be a limitation.

The operating system 450 may control the execution of other computer programs, and provides scheduling, input-output control, file and data management, memory management, and communication control and related services.

The application 460 may be a source program, executable program (object code), script, or any other entity comprising a set of instructions to be performed.

The I/O devices 470 may include input devices (or peripherals) such as, for example but not limited to, a mouse, keyboard, scanner, microphone, camera, etc. Furthermore, the I/O devices 470 may also include output devices (or peripherals), for example but not limited to, a printer, display, etc. Finally, the I/O devices 470 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 470 also include components for communicating over various networks, such as the Internet or an intranet. The I/O devices 470 may be connected to and/or communicate with the processor 410 utilizing Bluetooth connections and cables (via, e.g., Universal Serial Bus (USB) ports, serial ports, parallel ports, FireWire, HDMI (High-Definition Multimedia Interface), etc.).

When the computer 400 is in operation, the processor 410 is configured to execute software stored within the memory 420, to communicate data to and from the memory 420, and to generally control operations of the computer 400 pursuant to the software. The application 460 and the O/S 450 are read, in whole or in part, by the processor 410, perhaps buffered within the processor 410, and then executed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A superconducting quantum system, comprising:
a diamond substrate layer; and
a superconducting quantum device disposed on the diamond substrate layer, the superconducting quantum device comprising a superconducting quantum circuit formed on top a surface of the diamond substrate layer;
wherein the superconducting quantum circuit comprises a first superconductor metal layer disposed on top of the diamond substrate layer, an oxidized layer disposed on top of the first superconductor metal layer, and a second superconductor metal layer disposed on top of the oxidized layer such that the first superconductor metal layer and the second superconductor metal layer sandwich the oxidized layer in between.

2. The system of claim 1, wherein the diamond substrate layer is prepared from a single-crystal diamond substrate, a poly-crystalline synthetic diamond substrate, or both the single-crystal diamond substrate and the poly-crystalline synthetic diamond substrate.

3. The system of claim 1, wherein the first and second superconductor metal layers comprise aluminum or niobium.

4. The system of claim 1, wherein the diamond substrate layer is prepared from natural diamond.

5. The system of claim 1, wherein the superconducting quantum device includes a Josephson junction.

6. The system of claim 1, wherein the superconducting quantum device is a qubit.

7. The system of claim 1, wherein the superconducting quantum device is a transmon style qubit.

8. The system of claim 1, wherein the superconducting quantum device is fabricated by subtractive patterning of a material stack.

9. The system of claim 1, wherein the superconducting quantum device is fabricated by a Dolan bridge process.

10. The system of claim 1, wherein the diamond substrate layer is bulk diamond and not thin film diamond;
wherein the bulk diamond has a thickness in a range of 50 nanometers (nm) to hundreds of microns in contrast to the thin film diamond having a thickness of 5 nm or less.

11. A method of fabricating a superconducting quantum system, the method comprising:
preparing a diamond substrate layer; and
disposing a superconducting quantum device on the diamond substrate layer, the superconducting quantum device comprising a superconducting quantum circuit formed on top a surface of the diamond substrate layer;
wherein the superconducting quantum circuit comprises a first superconductor metal layer disposed on top of the diamond substrate layer, an oxidized layer disposed on top of the first superconductor metal layer, and a second superconductor metal layer disposed on top of the oxidized layer such that the first superconductor metal layer and the second superconductor metal layer sandwich the oxidized layer in between.

12. The method of claim 11, wherein the diamond substrate layer is prepared from a single-crystal diamond substrate, a poly-crystalline synthetic diamond substrate, or both the single-crystal diamond substrate and the poly-crystalline synthetic diamond substrate.

13. The method of claim 11, wherein the diamond substrate layer is prepared from natural diamond.

14. The method of claim 11, wherein the superconducting quantum device includes a Josephson junction.

15. The method of claim 11, wherein the superconducting quantum device is at least one of a qubit and a transmon style qubit.

16. The method of claim 11, wherein the superconducting quantum device is fabricated by subtractive patterning of a material stack.

17. The method of claim 11, wherein the superconducting quantum device is fabricated by a Dolan bridge process.

18. The method of claim 11, wherein the diamond substrate layer is bulk diamond and not thin film diamond;
wherein the bulk diamond has a thickness in a range of 50 nanometers (nm) to hundreds of microns in contrast to the thin film diamond having a thickness of 5 nm or less.

19. The method of claim 11, wherein the diamond substrate layer is at least one of generated by chemical vapor deposition and generated by plasma assisted chemical vapor deposition.

* * * * *